(12) United States Patent  
Matsumoto (10) Patent No.: US 8,303,171 B2  
(45) Date of Patent: Nov. 6, 2012

(54) COOLING CAPACITY MEASUREMENT METHOD FOR INVERTER DEVICE

(75) Inventor: Yoshihiro Matsumoto, Suzuka (JP)

(73) Assignee: Fuji Electric Co., Ltd. (JP)

( * ) Notice: Subject to any disclaimer, the term of this patent is extended or adjusted under 35 U.S.C. 154(b) by 550 days.

(21) Appl. No.: 12/612,368

(22) Filed: Nov. 4, 2009

(65) Prior Publication Data

US 2010/0111134 A1    May 6, 2010

(30) Foreign Application Priority Data

Nov. 4, 2008 (JP) .................................. 2008-283448  
Sep. 16, 2009 (JP) .................................. 2009-214394

(51) Int. Cl.  
*G01N 25/20* (2006.01)

(52) U.S. Cl. .......................................... 374/43; 374/173

(58) Field of Classification Search .................. 374/43, 374/173, 169, 4, 5, 20, 57, 145  
See application file for complete search history.

(56) References Cited

U.S. PATENT DOCUMENTS

| 6,630,754 | B1 * | 10/2003 | Pippin ........................ 374/173 |
| 6,975,047 | B2 * | 12/2005 | Pippin ........................ 374/173 |
| 7,109,680 | B2 * | 9/2006 | Kubo et al. ................. 374/169 |
| 7,111,983 | B2 * | 9/2006 | Hudson ....................... 374/152 |
| 7,607,827 | B2 * | 10/2009 | Karikomi et al. ............ 374/178 |
| 2010/0111134 | A1 * | 5/2010 | Matsumoto .................... 374/43 |

FOREIGN PATENT DOCUMENTS

JP          07-154976 A    6/1995

* cited by examiner

*Primary Examiner* — Yaritza Guadalupe-McCall  
(74) *Attorney, Agent, or Firm* — Rossi, Kimms & McDowell LLP (57) ABSTRACT

An inverter device is provided that can measure a decrease in cooling capacity caused by a finite service life of a cooling fan or clogging of a cooling fin, without being affected by an ambient temperature or a load state. A thermal time constant is calculated in a thermal time constant calculation circuit from a temperature detection value from a temperature detection circuit and a time signal from a timer on the basis of an operation/stop command for the inverter device. The calculated value of the thermal time constant calculated in the thermal time constant calculation circuit is compared by a comparator with a reference value of the thermal time constant that is stored in advance in a memory. Whether the cooling capacity has decreased is determined based on the comparison results.

20 Claims, 7 Drawing Sheets

COOLING CAPACITY MEASUREMENT METHOD FOR INVERTER DEVICE

BACKGROUND OF THE INVENTION

The present invention relates to an inverter device that includes an alternating current-direct current conversion unit that converts an alternating current input into a direct current, a smoothing capacitor that smoothes the output of the alternating current-direct current conversion unit, and a direct current-alternating current conversion unit that converts a direct current input into an alternating current, and that is provided with a cooling fin that carries a heat-generating component constituting the alternating current-direct current conversion unit and the direct current-alternating current conversion unit, and more particularly to a cooling capacity measurement method for an inverter device that can measure the decrease in cooling capacity caused by clogging of the cooling fin or decrease in the rotation speed due to finite service life of a cooling fan provided at the cooling fin.

In the inverter device of this type, a heat-generating component such as a rectifying diode or an IGBT that is a constituent component of the alternating current-direct current conversion unit and the direct current-alternating current conversion unit is placed on a cooling fin provided with a large number of fin portions, heat from the heat-generating component is conducted to the cooling fin and the heat is dissipated by a forced cooling system in which air is blown onto the cooling fin by a cooling fan and heat exchange is conducted.

The cooling fan is a component with a finite service life, and in order to extend the service life of the cooling fan, the temperature of the cooling body on which the heat-generating component is installed is detected and the cooling fan is started and stopped depending on the detected temperature value, for example, as disclosed in Japanese Patent Application Laid-open No. H7-154976.

According to Japanese Patent Application Laid-open No. H7-154976, the service life of the cooling fan can be extended, but because a function of predicting the end point of service life of the cooling fan is not provided, the end of service life of the cooling fan is detected for the first time when the cooling fan fails.

In other words, when the cooling fan is used for a long time, the mount of air blown by the fan decreases because of limited service life. As a result the cooling capacity also decreases. When the cooling capacity thus decreases, the temperature rises and a usability standard value of the heat-generating components such as IGBT is exceeded.

In the conventional system, the absolute value of temperature is detected with a temperature detector mounted on the cooling body, and in a case where the absolute value of temperature detected by the temperature detector exceeds the preset reference value, the service life of the cooling fan is determined to have ended, the protection of the inverter device is stopped and a display alarm signal is produced.

However, in such conventional system, because the service life end of the cooling fan is determined by the absolute value of temperature detected by the temperature detector mounted on the cooling body, the protection function is active with respect to the increase in ambient temperature, state of the load, and overloading, even if the cooling capacity of the cooling fan does not drop.

SUMMARY OF THE INVENTION

The present invention provides an inverter device that can measure the decrease in cooling capacity caused by clogging of the cooling fin or a finite service life of the cooling fan that cools the cooling fin, without being affected by an ambient temperature or load state.

Specifically, the present invention provides a cooling capacity measurement method for an inverter device that includes an alternating current-direct current conversion unit that converts an alternating current input into a direct current, a smoothing capacitor that smoothes the output of the alternating current-direct current conversion unit, and a direct current-alternating current conversion unit that converts a direct current input into an alternating current, and that is provided with a cooling fin that carries a heat-generating component constituting the alternating current-direct current conversion unit and the direct current-alternating current conversion unit, wherein a temperature detection mechanism that detects a temperature of the cooling fin is provided, and (1) a decrease in cooling capacity is determined based on a variation amount of a temperature detection value obtained from the temperature detection mechanism after the inverter device has made a transition from an operating state to a stopped state;

(2) a decrease in cooling capacity is determined based on a variation amount of a temperature detection value obtained from the temperature detection mechanism after the inverter device starts operating;

(3) a generation loss of the heat-generating components is calculated from information of at least one kind from among an output current, an output frequency, and an output power of the inverter device during operation, and a decrease in cooling capacity is determined from the calculated value and an detection value of the temperature detection mechanism.

The decrease in cooling capacity is measured by the inverter device itself on the basis of a variation amount of the temperature detection value after the inverter device has been stopped or after the inverter device starts operating, or on the basis of a generation loss of the heat-generating components during operation of the inverter device. As a result, the decrease in cooling capacity caused by clogging of the cooling fin or limited service life of the cooling fan provided at the cooling fin can be determined without being affected by an ambient temperature or load state even when the ambient temperature is high and generation loss is large.

Other features, advantages, modifications, etc. of the invention will become apparent to those skilled in the art from the following detailed description of the preferred embodiments.

BRIEF DESCRIPTION OF THE DRAWINGS

The invention will be described with reference to certain preferred embodiments thereof and the accompanying drawings, wherein.

DESCRIPTION OF THE PREFERRED EMBODIMENTS

Figure 1:
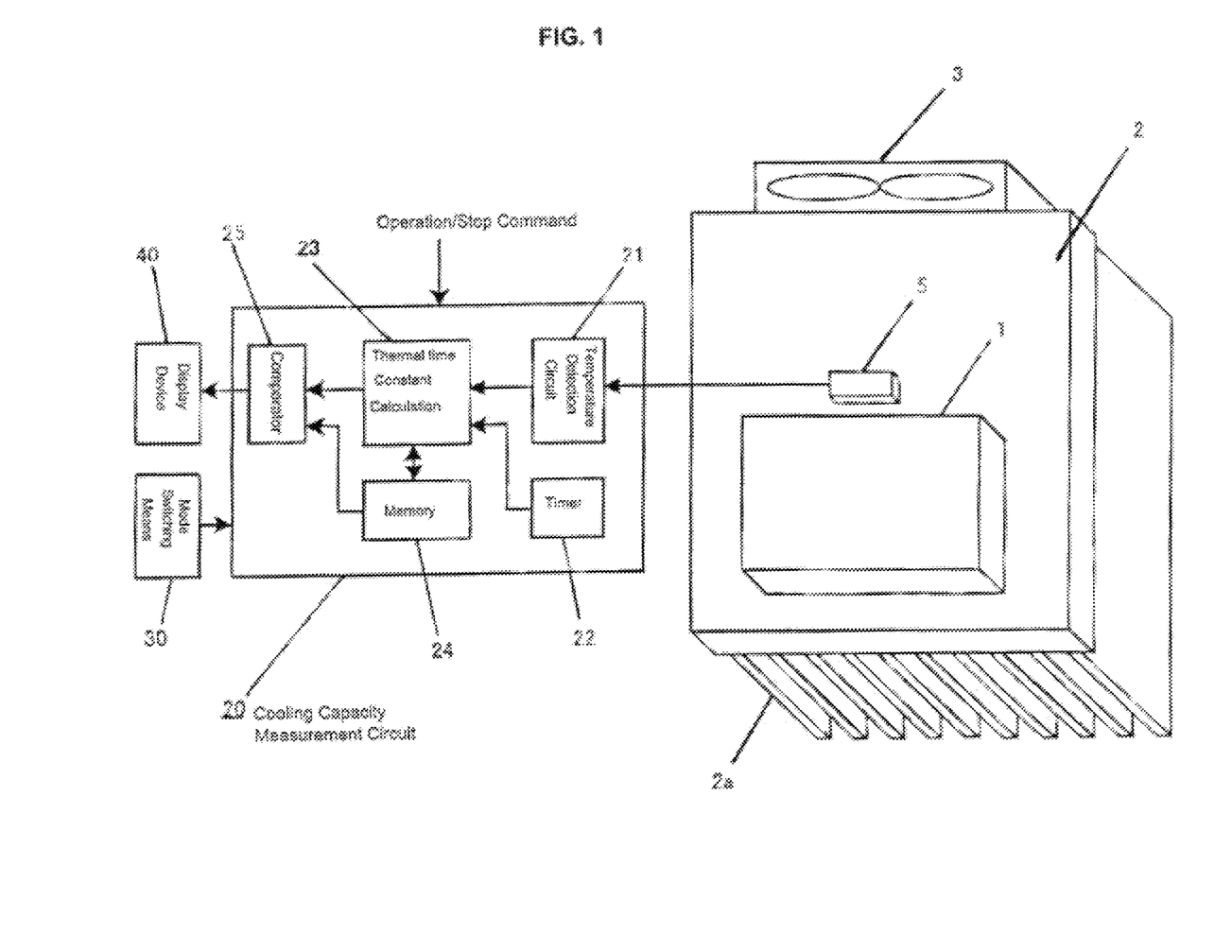
FIG. 1 is a structural diagram illustrating the first and second embodiments of the invention.

FIG. 1 is a structural diagram illustrating a first embodiment of the present invention. A heat-generating component 1, such as a diode and an IGBT that is a structural component of an alternating current-direct current conversion unit and a direct current-alternating current conversion unit, is provided on a cooling fin 2. The cooling fin 2 is provided with a large number of fin portions 2a. A cooling fan 3 cools the cooling fin 2. A temperature sensor 5 detects the temperature of the cooling fin 2 and is disposed on the cooling fin 2 in the vicinity of the heat-generating component 1.

A cooling capacity measurement circuit 20 is provided that includes a temperature detection circuit 21, a timer 22, a thermal time constant calculation circuit 23, a memory 24, and a comparator 25. The cooling capacity measurement circuit serves to determine a decrease in cooling capacity on the basis of a variation amount in a temperature detection value. The temperature detection circuit 21 outputs the temperature detection value that has been detected by the temperature sensor 5 to the thermal time constant calculation circuit 23. The thermal time constant calculation circuit 23 calculates a thermal time constant from the temperature detection value from the temperature detection circuit 21 and a time signal from the timer 22 on the basis of an operation/stop command from the inverter device. The comparator 25 compares the calculated value of the thermal time constant that has been calculated by the thermal time constant calculation circuit 23 with a reference value of the thermal time constant that is stored in advance in the memory 24 and determines whether the cooling capacity has decreased. A mode switching mechanism 30 is provided that selectively switches between a usual operation mode and a cooling capacity measurement mode, and a display device 40 displays the decrease in cooling capacity on the basis of the output of the comparator 25.

Figure 2:
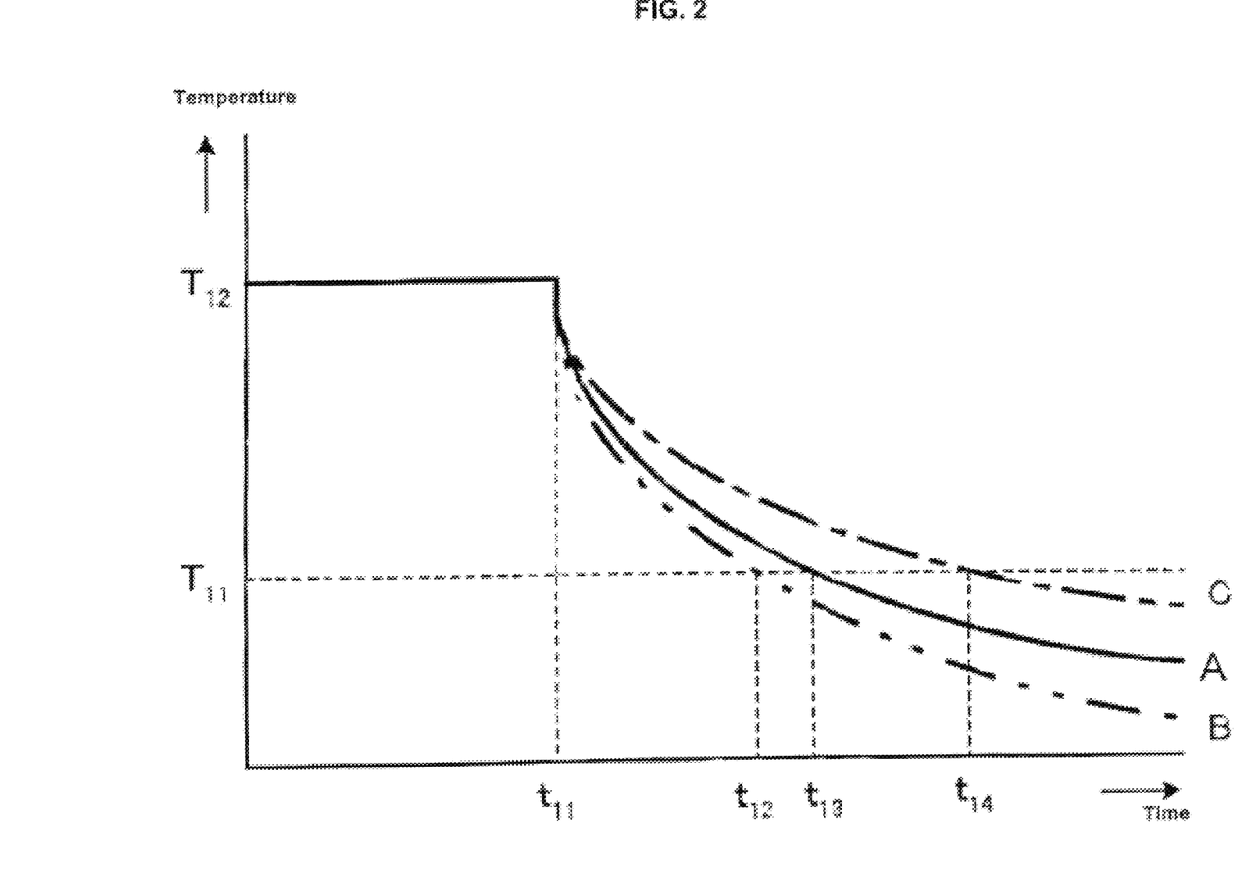
FIG. 2 is a characteristic diagram of temperature variations at the time the inverter device is stopped.

FIG. 2 is a characteristic diagram of temperature variations at the time the inverter device is stopped. A method for measuring the cooling capacity of the cooling fan will be described below. When the cooling capacity of the cooling fan 3 is measured, the cooling capacity measurement mode is selected by the mode switching mechanism 30. In this case, where the cooling capacity measurement mode is selected, the cooling fan 3 continues operating for a predetermined time even after the operation of the inverter device has been stopped.

Where a stop command for the inverter device is inputted, the operation of the operating inverter device is stopped at a time $t_{11}$, but the cooling fan 3 continues operating. A temperature detection value $T_{12}$, which is detected at the point in time (point in time $t_{11}$) at which the stop command is received and the operation of the inverter device is stopped, is inputted from the temperature detection circuit 21 into the thermal time constant calculation circuit 23. In the thermal time constant calculation circuit 23, the thermal time constant is calculated on the basis of time in which the temperature detection value of the cooling fin 2 decreases by a predetermined temperature variation amount $\Delta T_{C1}$, from that at the time the operation of the inverter device is stopped, that is, on the basis of time in which the temperature detection value drops from $T_{12}$ to $T_{11}$.

In a case where the rotation speed of the cooling fan 3 has decreased due to a finite service life thereof or in a case where the fin portions 2a of the cooling fin 2 are clogged with dust or the like, the thermal time constant increases because the cooling capacity decreases. Therefore, when the calculated value of the thermal time constant calculated in the thermal time constant calculation circuit 23 is compared with the reference value of the thermal time constant that is stored in advance in the memory 24 and the calculated value of the thermal time constant is longer than the reference value, a signal is outputted and the decrease in cooling capacity is displayed at the display 40. Further, when the cooling capacity is determined to have decreased, an alarm signal may be outputted.

In FIG. 2, a characteristic A serves as a reference value of the thermal time constant that has been set in advance and illustrates a case in which an interval from the time $t_{11}$ to the time $t_{13}$ is required for the temperature detection value $T_{12}$, which is detected at the point in time at which the inverter device has stopped operating, to change to $T_{11}$ (temperature variation amount $\Delta T_{C1}$). A characteristic B relates to normal cooling capacity and illustrates a case in which an interval from the time $t_{11}$ to the time $t_{12}$ is required for the temperature detection value $T_{12}$, which is detected at the point in time at which the inverter device has stopped operating, to change to $T_{11}$ (temperature variation amount $\Delta T_{C1}$). A characteristic C relates to a decreased cooling capacity and illustrates a case in which an interval from the time $t_{11}$ to the time $t_{14}$ is required for the temperature detection value $T_{12}$, which is detected at the point in time at which the inverter device has stopped operating, to change to $T_{11}$ (temperature variation amount $\Delta T_{C1}$). As shown in FIG. 2, in the case of characteristic B with a short thermal time constant, the cooling capacity of the cooling fan 3 is determined to be normal and in a case of characteristic C with a long thermal time constant, the cooling capacity is determined to have decreased (to have become abnormal) with respect to a reference value (characteristic A) of the thermal time constant that has been set in advance.

In the above-described explanation, the calculation of thermal time constant is conducted for one location of the interval in which the temperature detection value varies from $T_{12}$ to $T_{11}$, but the calculation of thermal time constant may be also conducted for two or more locations. Further, in the present embodiment, the thermal time constant is calculated on the basis of time in which the temperature decreases from first temperature detection value $T_{12}$, which is determined at the time the inverter device stops operating, to the second temperature detection value $T_{11}$, but the thermal time constant can be also found from the temperature variation amount per unit time after the inverter device operation has been stopped.

Further, in the above-described embodiment, the reference value of the thermal time constant is a value that has been set in advance, but it is also possible to provide the mode switching mechanism 30 with a reference value measurement mode and set the reference value of the thermal time constant on the basis of the thermal time constant that is calculated with the thermal time constant calculation circuit 23 when the inverter device is operated for the first time after being installed. More specifically, where the reference value measurement mode is selected by the mode switching mechanism 30 and a stop command is issued to the inverter device, the inverter device stops, but the cooling fan 3 continues operating. In the thermal time constant calculation circuit 23, the thermal time constant may be calculated from the temperature detection value from the temperature detection circuit 21 at the time the temperature variation value changes by $\Delta T_{C1}$ and the time signal from the timer 22, and a value obtained by multiplying the calculated thermal time constant by a predetermined gain (for example, +20%) may be stored as the reference value of the thermal time constant in the memory 24.

When the cooling capacity is measured, the selection of the cooling capacity measurement mode by the mode switching mechanism 30 may be performed by an appropriate manual operation or, for example, may be conducted automatically each time the integrated operation time of the inverter device or the integrated operation time of the cooling fan 3 reaches the predetermined time.

Figure 3:
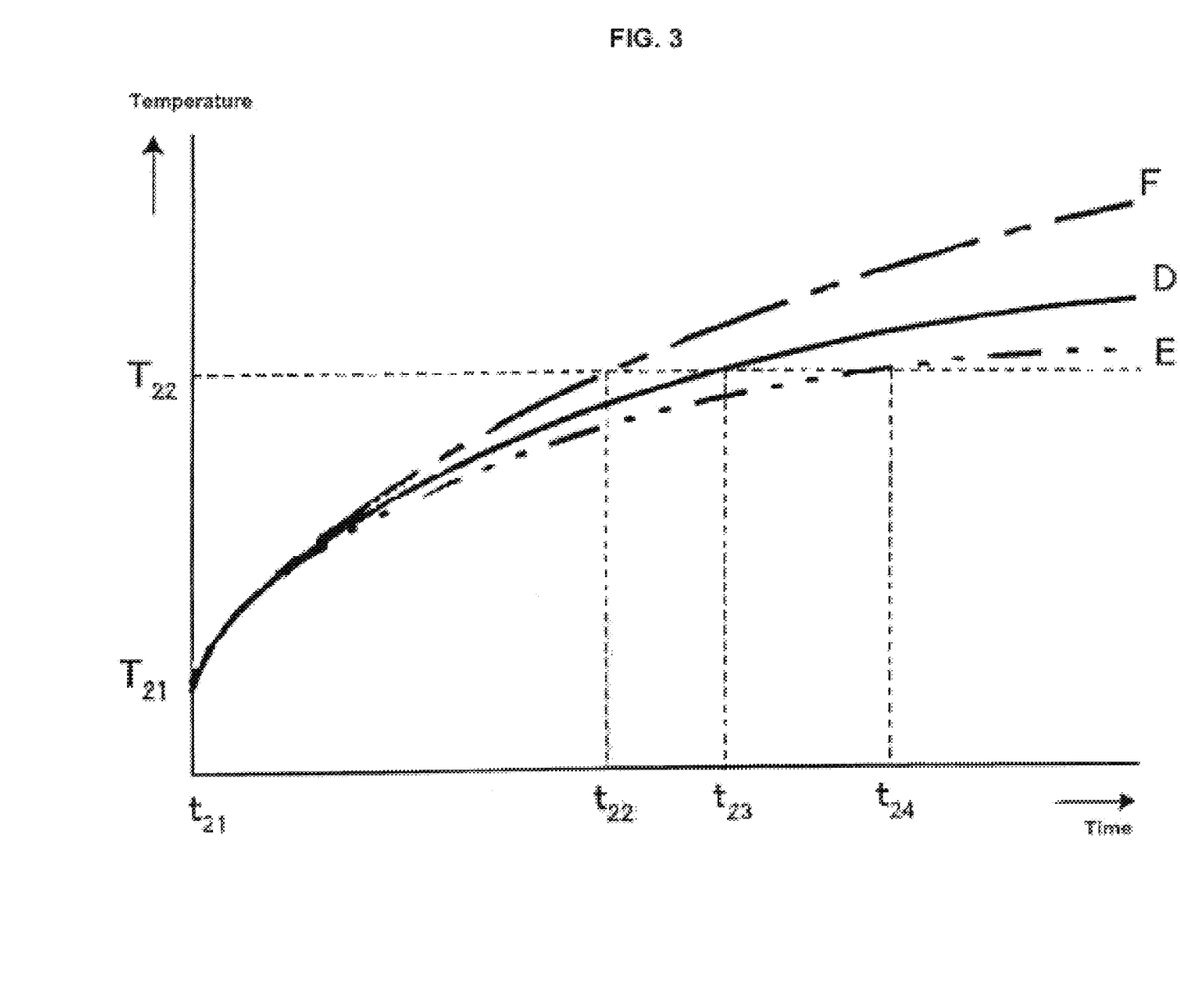
FIG. 3 is a characteristic diagram of temperature variations at the time the inverter device operation is started.

FIG. 3 is a characteristic diagram of temperature variations at the time the inverter device operation is started. A method for measuring the cooling capacity of the cooling fan of the second embodiment will be explained below with reference to FIG. 1 and FIG. 3. In FIG. 3 a characteristic D serves as a reference value of the thermal time constant that has been set in advance and illustrates a case in which an interval from the time $t_{21}$ to the time $t_{23}$ is required for the temperature detection value $T_{21}$, which is detected at the point in time $t_{21}$ at which the inverter device starts operating, to change to $T_{22}$ (temperature variation amount $\Delta T_{C2}$). A characteristic E relates to normal cooling capacity and illustrates a case in which an interval from the time $t_{21}$ to the time $t_{24}$ is required for the temperature detection value $T_{21}$, which is detected at the point in time at which the inverter device starts operating, to change to $T_{22}$ (temperature variation amount $\Delta T_{C2}$). A characteristic F relates to decreased cooling capacity and illustrates a case in which an interval from the time $t_{21}$ to the time $t_{22}$ is required for the temperature detection value $T_{21}$, which is detected at the point in time at which the inverter device starts operating, to change to $T_{22}$ (temperature variation amount $\Delta T_{C2}$).

Where an operation command is inputted in the inverter device, the inverter device starts operating at the time $t_{21}$ and the cooling fan 3 also starts operating. The temperature detection value $T_{21}$, which is detected at the point of time in which the inverter device receives the operation command and starts operating (time point $t_{21}$), is inputted from the temperature detection circuit 21 into the thermal time constant calculation circuit 23. The thermal time constant calculation circuit 23 calculates the thermal time constant on the basis of the time in which the temperature detection value of the cooling fin 2 rises by the predetermined temperature variation amount $\Delta T_{C2}$ from the operation start time of the inverter device, that is, on the basis of the time in which the temperature detection value rises from $T_{21}$ to $T_{22}$.

In a case where the rotation speed of the cooling fan 3 has decreased due to a finite service life thereof or in a case where the fin portions 2a of the cooling fin 2 are clogged with dust or the like, the thermal time constant at the time the operation is started decreases because the cooling capacity decreases. Therefore, the calculated value of the thermal time constant calculated in the thermal time constant calculation circuit 23 is compared, by the comparator 25, with the reference value of the thermal time constant that is stored in advance in the memory 24, and when the calculated value of the thermal time constant is shorter than the reference value, a signal is outputted and the decrease in cooling capacity is displayed at the display 40. Further, when the cooling capacity is determined to have decreased, an alarm signal may be outputted.

Thus, as shown in FIG. 3, in the case of characteristic E with a long thermal time constant, the cooling capacity is determined to be normal and in a case of characteristic F with a short thermal time constant, the cooling capacity is determined to have decreased (to have become abnormal) with respect to a reference value (characteristic D) of the thermal time constant that has been set in advance.

In the above-described explanation, the calculation of thermal time constant is conducted for one location of the interval in which the temperature detection value varies from $T_{21}$ to $T_{22}$, but the calculation of time thermal constant may be also conducted for two or more locations. Further, in the present embodiment, the thermal time constant is calculated on the basis of time in which the third temperature detection value $T_{21}$, which is determined at the time the inverter device starts operating, to the fourth temperature detection value $T_{22}$, but the thermal time constant can be also found from the temperature variation amount per unit time after the inverter device operation has been started.

Further, in the above-described second embodiment, the reference value of the thermal time constant may be a value that has been set in advance or it is also possible to provide the mode switching mechanism 30 with a reference value measurement mode and set the reference value of the thermal time constant on the basis of the thermal time constant that is calculated with the thermal time constant calculation circuit 23 when the inverter device is operated for the first time after being installed. Further, when the cooling capacity is measured, the selection of the cooling capacity measurement mode by the mode switching mechanism 30 may be performed by an appropriate manual operation or, for example, may be conducted automatically each time the integrated operation time of the inverter device or the integrated operation time of the cooling fan 3 reaches the predetermined time.

Figure 4:
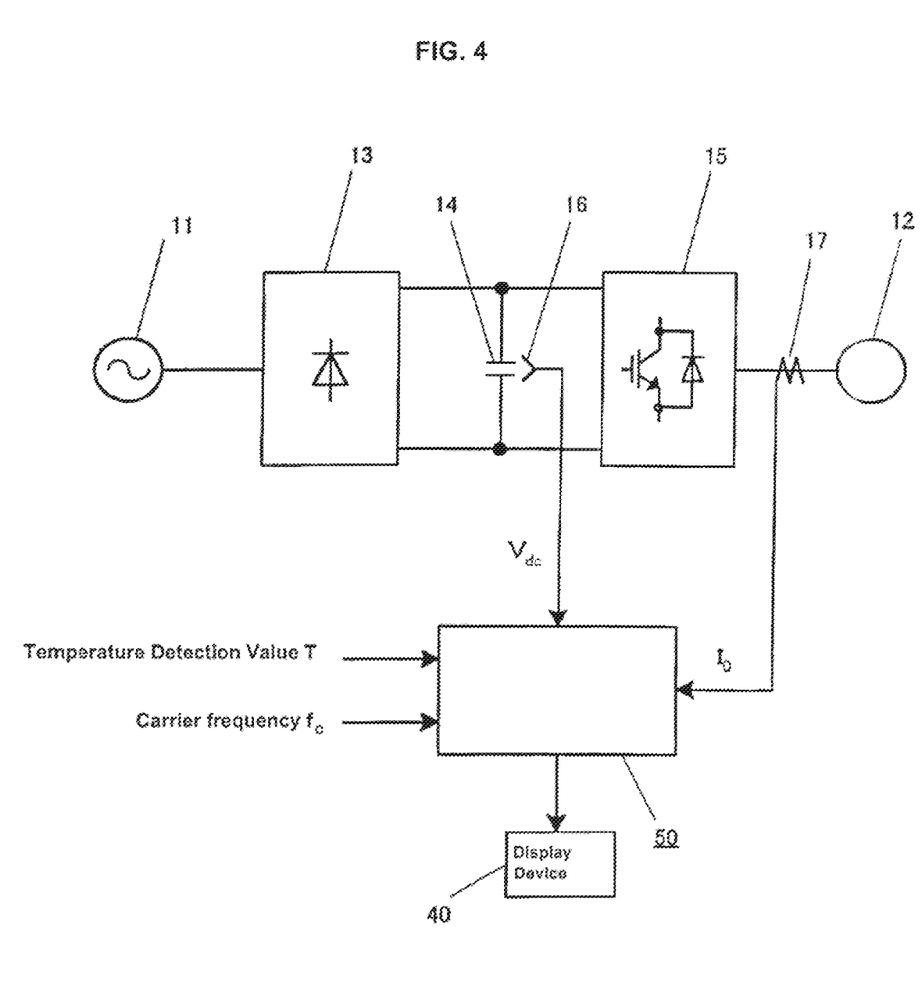
FIG. 4 is a structural diagram illustrating the third embodiment of the invention.

FIG. 4 is a circuit diagram illustrating the third embodiment of the present invention. In FIG. 4, an alternating current power source 11 supplies power to a load such as a motor 12. An alternating current-direct current conversion unit 13 that converts an alternating current input into a direct current. A smoothing capacitor 14 is provided that smoothes the output of the alternating current-direct current conversion unit 13. A direct current-alternating current conversion unit 15 converts a direct current input into an alternating current. A voltage detector 16 detects voltage between both terminals of the smoothing capacitor 14. A current detector 17 detects an output current of the inverter device.

Similar to the configuration shown in FIG. 1, a heat-generating component 1 such as a diode or an IGBT (see FIG. 1) that is a constituent component of the alternating current-direct current conversion unit 13 and direct current-alternating current conversion unit 15 is carried on a cooling fin 2 (see FIG. 1), and the cooling fin 2 is cooled by the cooling fan 3 (see FIG. 1). Further, a temperature sensor 5 (see FIG. 1) that detects the temperature of the cooling fin 2 is disposed on the cooling fin 2 in the vicinity of the heat-generating component 1.

The reference numeral 50 stands for a cooling capacity measurement circuit. When the inverter device operates, a thermal resistance $R_{th}$ of the cooling fin 2 is calculated from a temperature detection value T of the cooling fin 2 measured by the temperature sensor 5 and a generation loss $P_{loss}$ of the heat-generating component 1 that has been calculated from the output current detection value $I_0$ of the inverter device detected by the current detector 17, voltage detection value $V_{dc}$ that has been detected by the voltage detector 16, and carrier frequency $f_c$ of PWM control of the inverter device, and when the thermal resistance $R_{th}$ is larger than a reference value $R_0$ that has been set in advance, the cooling capacity is determined to have decreased and this decrease is displayed and/or an alarm signal indicating the decrease is produced.

Figure 5:
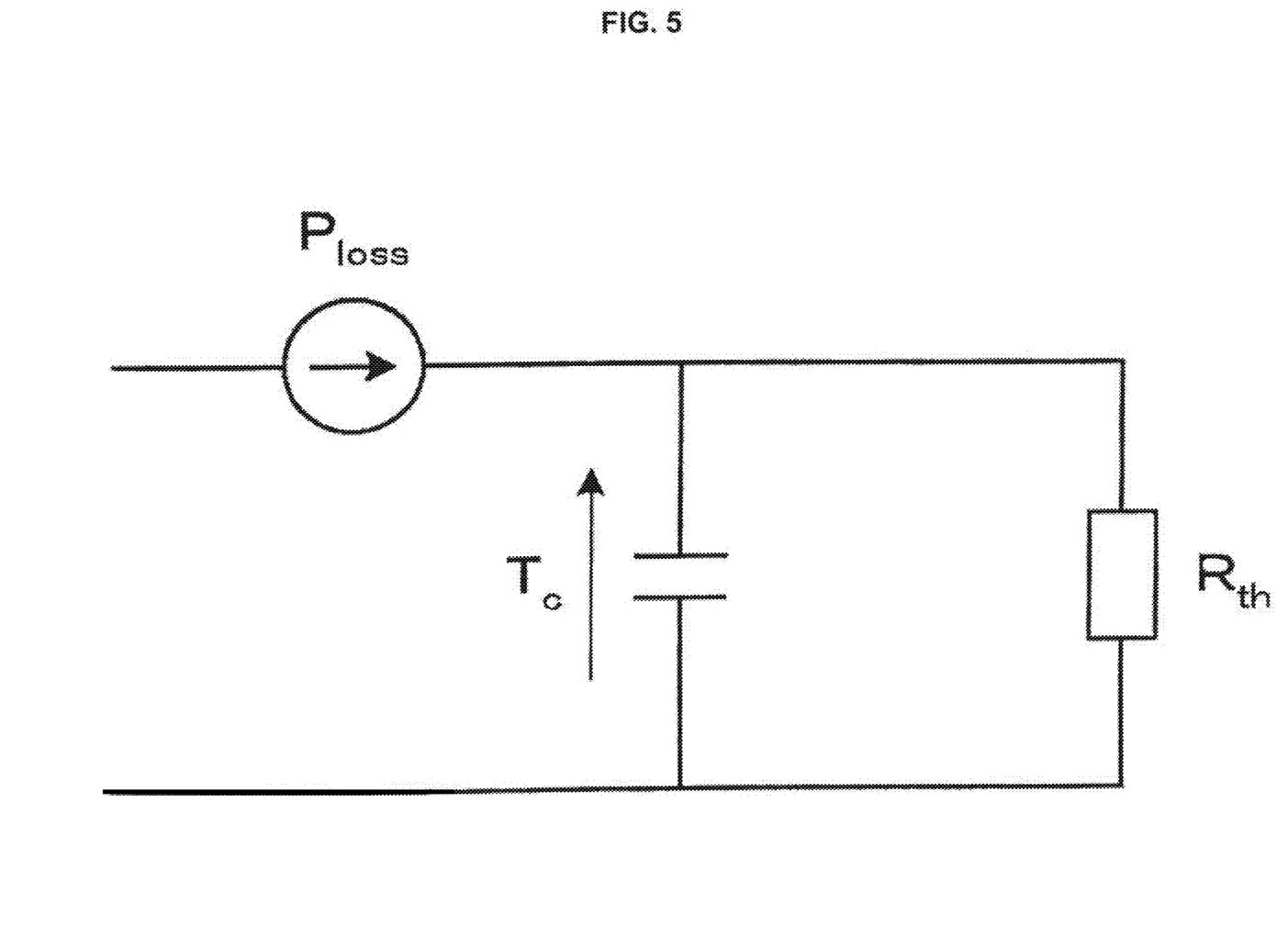
FIG. 5 is thermal equivalent circuit of the cooling fin during operation of the inverter device.

FIG. 5 shows a thermal equivalent circuit diagram of the cooling fan during operation of the inverter device. The temperature rise value $T_c$ of the cooling fin that is obtained from the temperature detection value T of the cooling fin 2 is represented by Equation (1).

$$T_c = P_{loss} \times R_{th} \qquad (1)$$

The generation loss $P_{loss}$ of the heat-generating component is represented by a stationary loss $P_{ON}$ and a switching loss $P_{SW}$. The stationary loss $P_{ON}$ is represented by a function of the output current detection value $I_0$ of the inverter device and the voltage detection value $V_{dc}$ of the voltage between both terminals of the smoothing capacitor 14, and the switching loss $P_{SW}$ is represented by a function of the output current detection value $I_0$ of the inverter device and the carrier frequency $f_c$. Therefore, the approximate generation loss $P_{loss}$ of the heat-generating component can be found from the output current detection value $I_0$, voltage detection value $V_{dc}$, and carrier frequency $f_c$.

Therefore, the cooling capacity measurement circuit 50 calculates the thermal resistance $R_{th}$ of the cooling fin 2 by Equation (1) from the temperature rise value $T_c$ of the cooling fin and the generation loss $P_{loss}$ of the heat-generating component that is found from the output current detection value $I_0$, voltage detection value $V_{dc}$, and carrier frequency $f_c$, and the calculated thermal resistance $R_{th}$ is compared with reference value $R_0$ that has been set in advance. In a case where the rotation speed of the cooling fan 3 has decreased due to a finite service life thereof or in a case where the fin portions 2a of the cooling fin 2 are clogged with dust or the like, the thermal resistance of the cooling fin 2 increases because the cooling capacity decreases. Therefore, when the calculated thermal resistance $R_{th}$ is less than the reference value $R_0$ that has been set in advance, the cooling capacity is determined to be normal, and when the calculated thermal resistance $R_{th}$ is greater than the reference value $R_0$ that has been set in advance, the cooling capacity is determined to have decreased (to have become abnormal). There the cooling capacity measurement circuit 50 determines that the cooling capacity of the cooling fan 3 has decreased, the decrease in cooling capacity is displayed at the display 40 and/or an alarm signal indicating the decrease is produced.

The voltage between the terminals of the smoothing capacitor 14 can be considered to be almost a constant value, the predetermined voltage value $V_{dc0}$ is stored in advance, and where the voltage value $V_{dc0}$ that has been stored is used for calculating the generation loss $P_{loss}$, the voltage between the terminals of the smoothing capacitor 14 is not necessary to detect. In this case, the decrease in cooling capacity can be easily determined from the temperature rise value $T_c$ of the cooling fin, current detection value $I_o$ of the inverter device, and carrier frequency $f_c$.

In the above-described third embodiment, the reference value $R_0$ of the thermal resistance may be a preset value, or it is also possible to provide the mode switching mechanism with a reference value measurement mode and set the reference value $R_0$ of thermal resistance on the basis of a value calculated when the inverter device is operated for the first time after being installed. Further, when the cooling capacity is measured, the selection of the cooling capacity measurement mode by the mode switching mechanism may be performed by an appropriate manual operation or, for example, may be conducted automatically each time the integrated operation time of the inverter device or the integrated operation time of the cooling fan 3 reaches the predetermined time.

Figure 6:
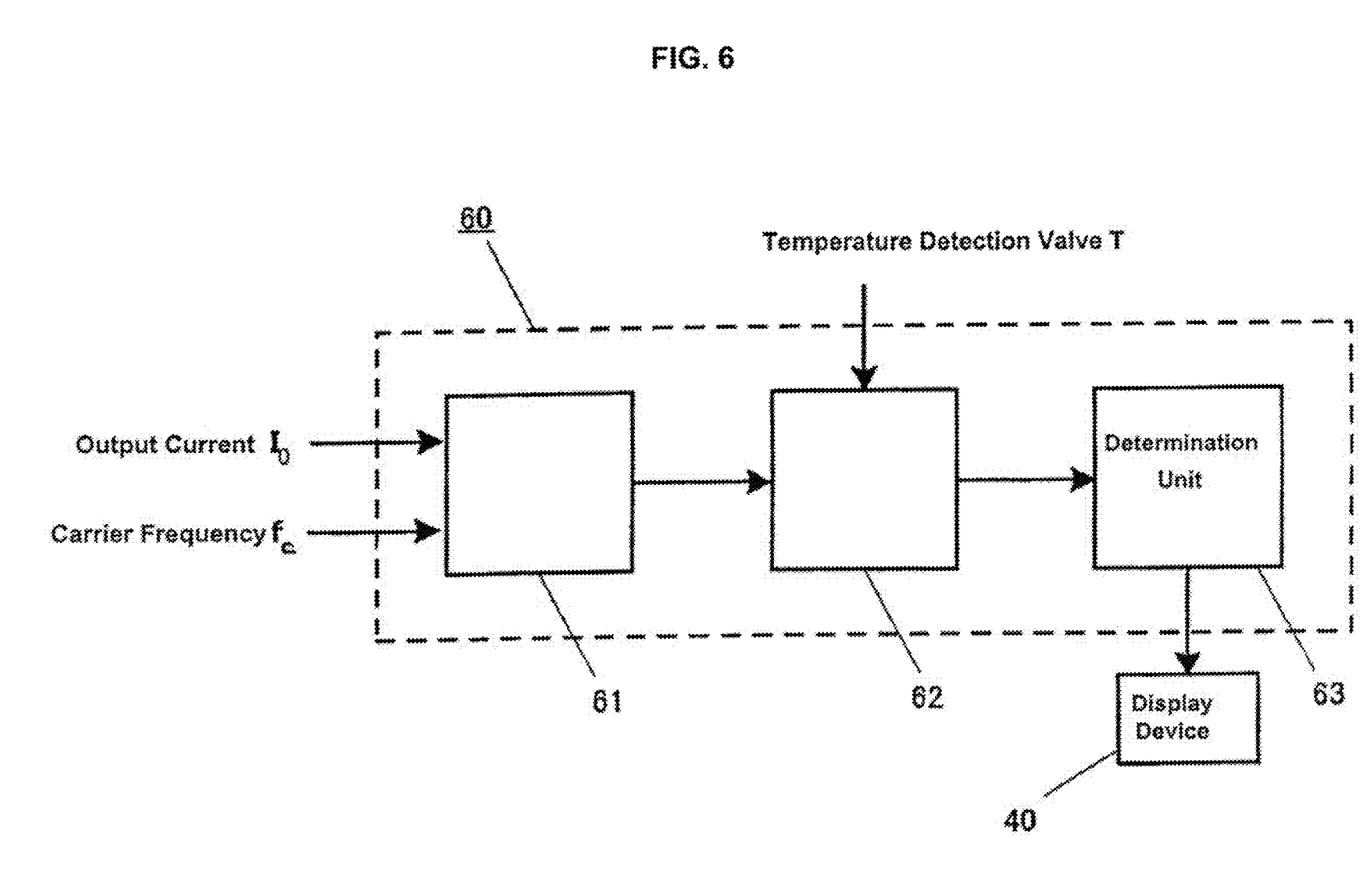
FIG. 6 is a circuit diagram illustrating the fourth embodiment of the invention.

FIG. 6 is a circuit diagram illustrating the fourth embodiment of the present invention. In FIG. 6, the reference numeral 60 stands for a cooling capacity measurement circuit that is constituted by a generation loss calculation unit 61 that calculates the generation loss $P_{loss}$ of the heat-generating component, a cooling capacity calculation unit 62 that calculates the cooling capacity from the generation loss $P_{loss}$ calculated by the generation loss calculation unit 61, and a determination unit 63 that compares the cooling capacity calculation value that has been calculated by the cooling capacity calculation unit 62 with the cooling capacity reference value that is stored in advance and determines whether the cooling capacity has decreased. The reference numeral 40 stands for a display device that displays that the cooling capacity has decreased on the basis of the output of the determination unit 63.

In the present embodiment, the generation loss $P_{loss}$, of the heat-generating component when the inverter device operates is represented by a function of the output current detection value $I_0$ and carrier frequency $f_c$, and the approximate value of the generation loss $P_{loss}$ of the heat-generating component is found from the output current detection value $I_o$ and carrier frequency $f_c$ on the basis of Equation (2).

$$P_{loss}=I_0(a+b\times f_c)+c \tag{2}$$

Here, a, b, and c are constants.

Referring to FIG. 6, in the generation loss calculation unit 61, the generation loss $P_{loss}$ is calculated when the inverter device operates from the output current detection value $I_0$ and carrier frequency $f_c$ on the basis of Equation (2). The generation loss $P_{loss}$ is inputted in the cooling capacity calculation unit 62, and the temperature detection value T of the cooling fin 2 that has been measured by the temperature sensor 5 is also inputted in the cooling capacity calculation unit 62. The cooling capacity is then calculated from the generation loss $P_{loss}$ and temperature rise value $T_c$ of the cooling fin on the basis of Equation (3) shown below. The temperature sensor 5 is disposed on the cooling fin 1 in the vicinity of the heat-generating component 1, as shown in FIG. 1.

$$\text{Cooling Capacity}=T_c/P_{loss} \tag{3}$$

In the determination unit 63, the calculated cooling capacity calculation value is compared with the cooling capacity reference value that has been set in advance, and when the cooling capacity calculation value is greater than the cooling capacity reference value, the decrease in cooling capacity (abnormality) is determined. In a case where the determination unit 63 determines that the cooling capacity has decreased, the decrease in cooling capacity is displayed at the display 40 and/or an alarm signal indicating the decrease is outputted.

Figure 7:
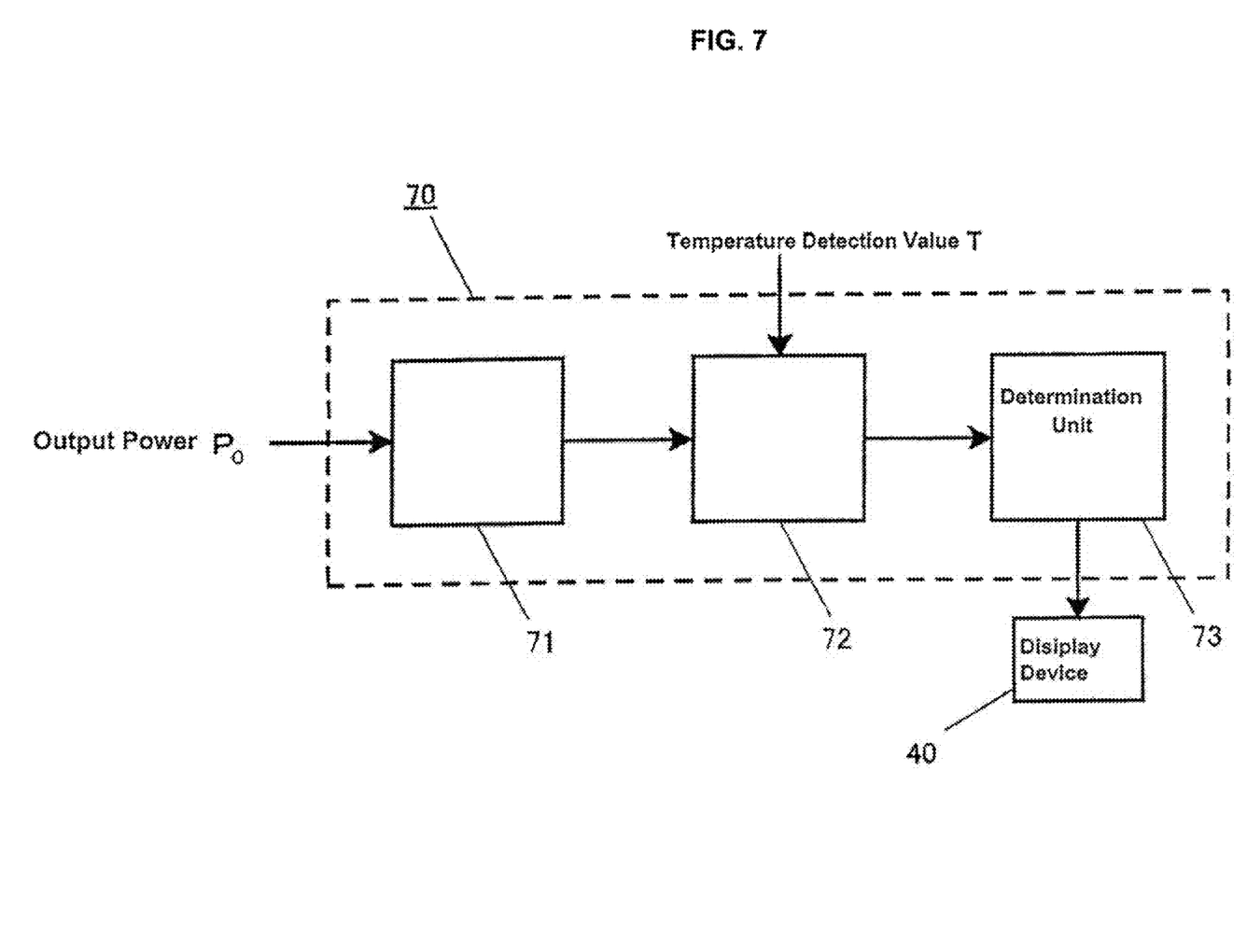
FIG. 7 is a circuit diagram illustrating the fifth embodiment of the invention.

FIG. 7 is a circuit diagram illustrating the fifth embodiment of the present invention. In FIG. 7, the reference numeral 70 stands for a cooling capacity measurement circuit that is constituted by a generation loss calculation unit 71 that calculates the generation loss $P_{loss}$ of the heat-generating component from an output power value $P_0$, a cooling capacity calculation unit 72 that calculates the cooling capacity from the generation loss $P_{loss}$ calculated by the generation loss calculation unit 71, and a determination unit 73 that compares the cooling capacity calculation value that has been calculated by the cooling capacity calculation unit 72 with the cooling capacity reference value that is stored in advance and determines whether the cooling capacity has decreased.

In the present embodiment, the energy amount that is lost by the inverter device itself (generation loss $P_{loss}$) from among the energy amount supplied by the inverter device to a load is found in advance by a test or the like and stored correspondingly to the supplied amount of energy, and the generation loss $P_{loss}$ is calculated based on the stored value.

For example, in a case where the efficiency of the inverter device is 90%, the generation loss $P_{loss}$ is uniquely determined as 10%, and the generation loss $P_{loss}$ is calculated in the generation loss calculation unit 71 from the output power value $P_0$. In this case, the output power value $P_0$ can be found from the detection value of the output current and a detection value of the output voltage of the inverter device, a command value of the output current and the command value of the output voltage, and a detection value of the direct current and a detection value of the direct voltage in the direct current intermediate section of the inverter device.

The generation loss $P_{loss}$ is inputted into the cooling capacity calculation unit 72, the temperature detection value T of the cooling fin 2 that has been measured by the temperature sensor 5 is also inputted into the cooling capacity calculation unit 72, and the cooling capacity is calculated from the generation loss $P_{loss}$ and the temperature rise value $T_c$ on the basis of Equation (3). In the determination unit 73, the calculated cooling capacity calculation value is compared with the cooling capacity reference value that has been set in advance, and when the cooling capacity calculation value is greater than the cooling capacity reference value, the decrease in cooling capacity (abnormality) is determined. In a case where the determination unit 73 determines that the cooling capacity has decreased, the decrease in cooling capacity is displayed at the display 40 and/or an alarm signal indicating the decrease is outputted.

In the generation loss calculation unit 71, the detection value $I_0$ of the output current or a torque command value calculated in the inverter device can be used instead of the output power value $P_0$ to calculate the generation loss $P_{loss}$. As for the characteristic of the output current $I_0$ and generation loss $P_{loss}$ of the inverter device or the characteristic of the output power $P_0$ and generation loss $P_{loss}$ of the inverter device, a characteristic table may be found in advance by a test or the like and stored and the generation loss $P_{loss}$ may be found based on the characteristic table.

Further, in a case where a load (mechanical device) that will be connected to the inverter device has been found in advance, because the output power value $P_0$ and revolution speed of the electric motor are in proportional relationship, the generation loss $P_{loss}$ can be calculated from the revolution speed of the electric motor (for example, a frequency command value of the inverter device). Thus, in a case where the load has been determined, the characteristic of the output power and output frequency is found in advance by a test or the like and stored. As a result, the generation loss $P_{loss}$ can be calculated from the output frequency by inputting the output frequency of the inverter device into the generation loss calculation unit 71. Alternatively, the characteristic table of the output frequency and generation loss $P_{loss}$ of the inverter device may be found in advance by a test or the like and stored, and the generation loss $P_{loss}$ may be found on the basis of this characteristic table.

The invention has been described with reference to certain preferred embodiments thereof. It will be understood, however, that variations and modifications are possible within the scope of the appended claims. For example, in the above-described embodiments, a case is explained in which the inverter device is provided with the cooling fan 3, and the decrease in cooling capacity is found that is caused by clogging of the cooling fins 2 or a limited service life of the cooling fan 3 provided at the cooling fin 2. However, the decrease in cooling capacity can be determined in a similar manner also with respect to an inverter device that is not provided with the cooling fan 3. In a case where the cooling fan 3 is not provided, the decrease in cooling capacity caused by clogging of the cooling fins 2 is determined.

This application claims priority from Japanese Application No. 2008-283448 filed Nov. 4, 2008 and Japanese Application No. 2009-214394 filed Sep. 16, 2009, the contents of each of which are incorporated herein in their entirety.

What is claimed is:

1. A cooling capacity measurement method for an inverter device that includes an alternating current-direct current conversion unit that converts an alternating current input into a direct current, a smoothing capacitor that smoothes the output of the alternating current-direct current conversion unit, and a direct current-alternating current conversion unit that converts a direct current input into an alternating current, a cooling fin that carries a heat-generating component constituting the alternating current-direct current conversion unit and the direct current-alternating current conversion unit, and a temperature detection mechanism that detects a temperature of the cooling fin, wherein the cooling capacity measurement method comprises:

obtaining a temperature detection value from the temperature detection mechanism; and determining a decrease in cooling capacity based on a variation amount of a temperature detection value obtained from the temperature detection mechanism after the inverter device has made a transition from an operating state to a stopped state.

2. The cooling capacity measurement method for an inverter device according to claim 1, wherein the variation amount of the temperature detection value is a time in which the temperature decreases from a first predetermined temperature to a second predetermined temperature.

3. The cooling capacity measurement method for an inverter device according to claim 1, wherein the variation amount of the temperature detection value is a temperature variation amount per unit time.

4. The cooling capacity measurement method for an inverter device according to claim 1, wherein a thermal time constant is calculated from the variation amount of the temperature detection value, and a decrease in cooling capacity is determined when the thermal time constant is longer than a predetermined value.

5. The cooling capacity measurement method for an inverter device according to claim 1, wherein a mode for measuring the cooling capacity is provided.

6. The cooling capacity measurement method for an inverter device according to claim 1, wherein when a decrease in cooling capacity is determined the decrease is displayed on a display unit.

7. The cooling capacity measurement method for an inverter device according to claim 1, wherein an alarm signal indicating the decrease is generated when a decrease in cooling capacity is determined.

8. A cooling capacity measurement method for an inverter device that includes an alternating current-direct current conversion unit that converts an alternating current input into a direct current, a smoothing capacitor that smoothes the output of the alternating current-direct current conversion unit, and a direct current-alternating current conversion unit that converts a direct current input into an alternating current, a cooling fin that carries a heat-generating component constituting the alternating current-direct current conversion unit and the direct current-alternating current conversion unit, and a temperature detection mechanism that detects a temperature of the cooling fin, wherein the cooling capacity measurement method comprises:

obtaining a temperature detection value with the temperature detection mechanism; and determining a decrease in cooling capacity based on a variation amount of a temperature detection value obtained from the temperature detection mechanism after the inverter device starts operating.

9. The cooling capacity measurement method for an inverter device according to claim 8, wherein the variation amount of the temperature detection value is a time in which the temperature rises from a third predetermined temperature to a fourth predetermined temperature.

10. The cooling capacity measurement method for an inverter device according to claim 8, wherein the variation amount of the temperature detection value is a temperature variation amount per unit time.

11. The cooling capacity measurement method for an inverter device according to claim 8, wherein a thermal time constant is calculated from the variation amount of the temperature detection value, and a decrease in cooling capacity is determined when the thermal time constant is shorter than a predetermined value.

12. The cooling capacity measurement method for an inverter device according to claim 8, wherein a mode for measuring the cooling capacity is provided.

13. The cooling capacity measurement method for an inverter device according to claim 8, wherein when a decrease in cooling capacity is determined the decrease is displayed on a display unit.

14. The cooling capacity measurement method for an inverter device according to claim 8, wherein an alarm signal indicating the decrease is generated when a decrease in cooling capacity is determined.

15. A cooling capacity measurement method for an inverter device that includes an alternating current-direct current conversion unit that converts an alternating current input into a direct current, a smoothing capacitor that smoothes the output of the alternating current-direct current conversion unit, and a direct current-alternating current conversion unit that converts a direct current input into an alternating current, a cooling fin that carries a heat-generating component constituting the alternating current-direct current conversion unit and the direct current-alternating current conversion unit, and a temperature detection mechanism that detects a temperature of the cooling fin, wherein the cooling capacity measurement method comprises:

calculating a generation loss of the heat-generating components from information of at least one kind from among an output current, an output frequency, and an output power of the inverter device during operation; and determining a decrease in cooling capacity from the calculated value and a detection value of the temperature detection mechanism.

16. The cooling capacity measurement method for an inverter device according to claim 15, wherein a cooling capacity decrease is determined by calculating a cooling capacity from a detection value of the temperature detection mechanism and a generation loss of the heat-generating component calculated from an output current of the inverter device and a carrier frequency and by comparing the calculated cooling capacity with a preset reference value.

17. The cooling capacity measurement method for an inverter device according to claim 15, wherein a cooling capacity decrease is determined by calculating a cooling capacity from a detection value of the temperature detection mechanism and a generation loss of the heat-generating component calculated from an output current of the inverter device, a voltage between two terminals of the smoothing capacitor, and a carrier frequency and by comparing the calculated cooling capacity with a preset reference value.

18. The cooling capacity measurement method for an inverter device according to claim 15, wherein a mode for measuring the cooling capacity is provided.

19. The cooling capacity measurement method for an inverter device according to claim 15, wherein when a decrease in cooling capacity is determined the decrease is displayed on a display unit.

20. The cooling capacity measurement method for an inverter device according to claim 15, wherein an alarm signal indicating the decrease is generated when a decrease in cooling capacity is determined.

* * * * *